Feb. 20, 1962 D. L. MILAM 3,021,595

OHMIC CONTACTS FOR SILICON CONDUCTOR DEVICES
AND METHOD FOR MAKING

Filed July 2, 1958

INVENTOR

David L. Milam

BY *Stevens, Davis, Miller & Mosher*

ATTORNEYS

United States Patent Office 3,021,595
Patented Feb. 20, 1962

3,021,595

OHMIC CONTACTS FOR SILICON CONDUCTOR DEVICES AND METHOD FOR MAKING

David L. Milam, Dallas, Tex., assignor to Texas Instruments Incorporated, Dallas, Tex., a corporation of Delaware Filed July 2, 1958, Ser. No. 746,114
5 Claims. (Cl. 29—473.1)

This invention relates to improvements in ohmic contacts or connections for silicon semiconductor devices and to a method for making such contacts or connections.

Silicon semiconductor devices are made in various forms. Typical of these devices are silicon transistors which in some cases are comprised of small bars of silicon about 0.030 by 0.030 inch in cross section, and about 0.25 inch in length. Although the given dimensions refer to grown junction silicon transistors, the invention is applicable to all forms of silicon semiconductor devices. Continuing with the chosen example, each small silicon bar has end portions exhibiting one type, either p or n, of electrical conductivity and a narrow layer extending transversely, somewhere near the midpoint of the bar, which exhibits the opposite type of electrical conductivity. Electrical contacts or connections must be made to this intermediate layer, which is known as the base layer of the transistor, and to the end portions which constitute the emitter and collector layers of the transistor. Provisions are also made for supporting and enclosing the transistor bar.

This invention is concerned with the making of connections or contacts to the ends of the silicon transistor bar, and; since no rectification of the electrical current is desired at their points, these connections or contacts must be of the type known as ohmic or non-rectifying contacts. The connection that is made to the base layer of the transistor bar presents its own peculiar problems, but this invention is not concerned with them.

Previously, many different methods and materials for making the ohmic connections to the emitter and collector layers of silicon transistor bars have been proposed and some of them have been commercially successful. However, prior to this invention considerable difficulty was still encountered in making these ohmic connections since all of the proposed materials failed in some degree to meet one or more of the following requirements. First of all, the material or solder used for the connection must have the ability to wet and stick to silicon. Secondly, the material used for the connection should have a relatively low melting point, since high temperatures may injure or destroy the very characteristics necessary in the silicon bars for them to function as transistors. Thirdly, the material of the contact must be soft and pliable enough or have a thermal coefficient of expansion sufficiently close to that of silicon so that temperature extremes will not cause the contact to become detached from the bar because of the difference in the expansion or contraction of the two materials. Finally, since an ohmic connection is desired, the material must not alter the conductivity type of the silicon material immediately adjacent the contact.

Some success has been had in affixing ohmic contacts to silicon transistor bars by electroplating the ends of the bars with rhodium or nickel and then attaching a wire to this coating with ordinary tin-lead solder. The plating is necessary since the solder will not stick to the silicon itself. However, these contacts are quite susceptible to cracking and detachment and are therefore unreliable.

The present invention provides a simpler, easier and quicker method for attaching electroconductive leads to the ends of silicon bars. The attachment is accomplished without damage to the characteristics of the bars and is quite permanent since it displays a high resistance to cracking and detachment. In addition, the contact material is etch-resistant, making it unnecessary to mask the contact from the etching fluids used during fabrication of the device.

Briefly, the present method of attaching electrical connections to the ends of silicon bars consists of dipping the ends of the silicon bars into an alloy consisting of approximately 40% by weight of gold, 55% by weight of lead and 5% by weight of indium. In certain instances, it may be desirable to add to this alloy, a small amount of an element capable of affecting the conductivity type of the silicon material adjacent the contact. Antimony and arsenic are examples of the additive elements which may be used. However, it is preferred not to use such additive elements unless absolutely necessary since the presence of these elements causes the contact material to become more brittle and less resistant to cracking or detachment.

The dipping of the ends of the silicon bars and the resultant coating thereof by this alloy, is accomplished in the presence of cesium fluoride, which acts as a flux, and at a temperature slightly above the melting point of the cesium fluoride, about 684° C. The ends of the transistor bars are preferably dipped into the alloy for a period of time only long enough for them to acquire a thin coating. The bars are held during the time they are dipped by tweezers or tongs or other means that will act as a heat sink so as to prevent overheating of the transistor bars. The dipping operation is preferably conducted in an atmosphere of helium, argon or other inert gas. It has been discovered that the cesium fluoride flux causes the alloy to wet and stick to the silicon at a temperature substantially lower than if the making of the contact is attempted without using the flux.

The alloy named forms a coating on the bar which is a satisfactory base for the attachment of electrical connections by the use of a low temperature solder, thus avoiding exposure of the silicon bar to temperatures which may be high enough to affect the electrical characteristics of the bar or to cause "cracking out" of the contact.

Further details and advantages of the invention will be apparent from the following detailed description of the practice of the preferred embodiment thereof as illustrated in the accompanying drawing, in which.

Figure 1:
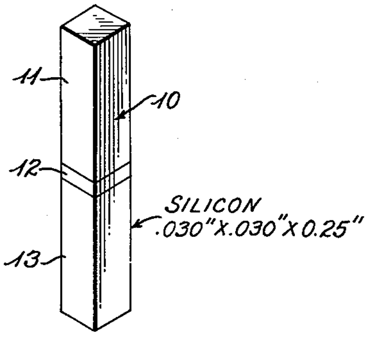
FIG. 1 is a perspective view of a typical silicon bar.
Figure 2:
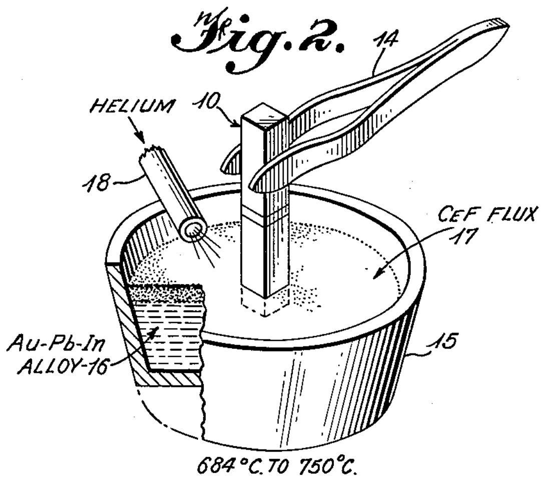
FIG. 2 is a perspective view, partially in section, illustrating the operation of dipping one end of the silicon transistor bar into the alloy of this invention.

As previously mentioned, a typical silicon transistor bar 10 is about 0.030 x 0.030 inch in cross section by about 0.25 inch in length, and consists of an end section 11, known as the emitter layer or section, separated by a thin layer 12, known as the base section, from another end section 13, known as the collector section. An n-p-n transistor bar has been selected for use in illustrating the preferred embodiment of this invention, and is shown in FIG. 1. It will be understood, however, that ohmic connections may be made to other forms of silicon semiconductor elements, including p-n-p transistor bars, in accordance with the principles of the present invention.

In accordance with the illustrated embodiment of this invention, the silicon transistor bar illustrated in FIG. 1 is picked up individually by a pair of tweezers 14, and the end to be coated is dipped into a crucible 15, which contains an alloy 16 on the surface of which there is floated a quantity of melted cesium fluoride 17 to act as a flux. The alloy is preferably about 40% by weight of gold, 55% by weight of lead and 5% by weight indium. The silicon bar is allowed to remain only briefly in the alloy, and then, as soon as a coating of the alloy will adhere to the bar, it is withdrawn and allowed to cool. During the dipping operation, the temperature of the alloy is maintained slightly above 684° C. (the melting temperature of cesium fluoride) and preferably between 684° C. and 750° C. Temperatures somewhat above this can be used, but are generally considered less satisfactory, since they tend to overheat the transistor bar and cause injury and damage. During the dipping operation, an atmosphere of helium, argon or some other inert gas is maintained in the area where the dipping takes place. Any suitable and well known means for maintaining this atmosphere around the area of dipping may be utilized, as for example, a nozzle 18 through which a stream of helium is continuously directed into the crucible 15.

It should be noted at this point that in the example used, ohmic contacts are made by the disclosed alloy to n-type silicon, even though the only active or conductivity type affecting impurity contained in the alloy is p-type. It has been found that this alloy will form ohmic contacts to n-type silicon if the resistivity of the silicon material is below about 2 ohm-centimeters. For silicon of a resistivity greater than about 2 ohm-centimeters, it may be necessary to add to the alloy a small amount, up to about 2% by weight, of an n-type active impurity, such as arsenic or antimony in order to produce ohmic contacts. Preferably, the amount of n-type active impurity in the alloy is kept as low as possible since, as noted above, the presence of these impurities in the alloy causes the contacts produced to be more susceptible to crack out. The basic alloy produces ohmic contacts to p-type silicon of any resistivity, of course.

After dipping the first few bars of a group to be run, a visual inspection will reveal whether or not these have been coated by the alloy. The length of time for which the remaining bars are allowed to remain in the alloy can then be adjusted until it is just sufficient to cause the alloy to wet and coat their ends. The other ends of the bars are dipped still using the tweezers to grip them near their mid-section and act as a heat sink. The surface of the flux in the dipping area may become encrusted from time to time with crystallized flux, but this can be removed by skimming the surface with a quartz rod.

Figure 3:
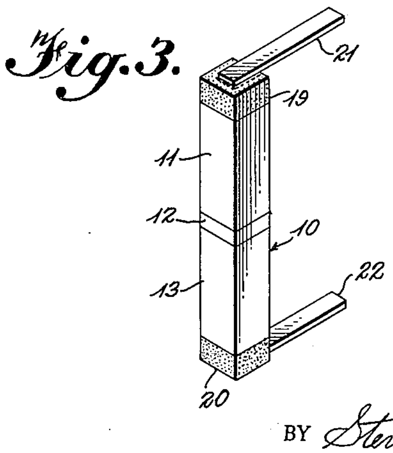
FIG. 3 is a perspective view of a completed silicon bar, with the two ohmic end contacts having been made.

The resultant coated bar, as shown in FIG. 3, has a coating on each end at 19 and 20, to which electrical leads 21 and 22 are easily attached by means of a soft (low melting point) solder such as a lead-indium solder. The electrical leads 21 and 22 may be of copper, steel, tungsten or any one of the various iron-nickel alloys. It has been found that an iron-nickel-cobalt alloy coated with gold is very satisfactory for this purpose. A satisfactory soft solder, such as pure tin, a tin-lead solder, or several of the various indium base alloy solders sold under the trademark, "Indalloy," may be used for attaching these leads.

Since cesium fluoride is soluble in water, it may be removed by washing the coated transistor bars several times in distilled water and drying them. The coated ends of the bars will ordinarily not require fluxing to cause a soft solder to adhere to the coating, but solder flux can be used and removed in the usual way, if desired.

Apparently, the lead-gold-indium alloy of the present invention tends to alloy itself to a certain extent with the surface material of the silicon bars, even at the relatively low temperature at which the coating takes place, thus forming good, firm contacts. A further advantage of the contacts of the present invention stems from their resistance to semiconductor etching fluids, such as hydrofluoric acid and nitric acid.

Although the invention has been shown and described in terms of a preferred embodiment, it is within the purvue of the invention to include the changes and modifications obvious to those skilled in the art which do not materially depart from the spirit, as well as the literal wording, of the appended claims.

What is claimed is:

1. A method of making an ohmic electrical connection to a silicon semiconductor element that comprises maintaining an alloy consisting essentially of 40% by weight gold, 55% by weight lead, and 5% by weight indium at a temperature slightly above 684° C., maintaining a cesium fluoride flux on top of said alloy, dipping a portion of a silicon semiconductor element briefly into said alloy through said flux to allow a coating of said alloy to adhere thereto, and thereafter soft soldering an electrically conductive lead to the alloy adhering to the silicon semiconductor element.

2. A method of making an ohmic electrical connection to a silicon semiconductor element of the p-n-p type that comprises maintaining at a temperature slightly above 684° C. an alloy consisting essentially of 40% by weight gold, 55% by weight lead, and 5% by weight indium, contacting a p-type portion of said silicon semiconductor element with said alloy in the presence of cesium fluoride to cause said alloy to adhere as a coating to said silicon semiconductor element, and thereafter soft soldering an electrically conductive lead to the coated portion of said silicon semiconductor element.

3. A method of making an ohmic electrical connection to a silicon semiconductor element of the n-p-n type wherein the resistivity of at least one of the n-type regions of said element is less than about 2 ohm-centimeters that comprises maintaining at a temperature slightly above 684° C. an alloy consisting essentially of 40% by weight gold, 55% by weight lead, and 5% by weight indium, contacting a portion of said at least one n-type region of said silicon semiconductor element with said alloy in the presence of cesium fluoride to cause said alloy to adhere as a coating to said portion of said at least one n-type region, and thereafter soft soldering an electrically conductive lead to the coated portion of said silicon semiconductor element.

4. A method of making an ohmic electrical connection to a silicon semiconductor element of the n-p-n type that comprises maintaining at a temperature slightly above 684° C. an alloy consisting essentially of 40% by weight gold, 55% by weight lead, 5% by weight indium and a minor amount of an n-type active impurity, contacting an n-type portion of said silicon semiconductor element with said alloy in the presence of cesium fluoride to cause said alloy to adhere as a coating to said silicon semiconductor element, and thereafter soft soldering an electrically conductive lead to the coated portion of said silicon semiconductor element.

5. A method according to claim 1 wherein said silicon semiconductor element has a region of N-type conductivity to which ohmic electrical connection is to be made and wherein said alloy contains a minor proportion of an N-type active impurity element.

References Cited in the file of this patent

UNITED STATES PATENTS

| | | |
|---|---|---|
| 2,464,821 | Ludwick et al. | Mar. 22, 1949 |
| 2,782,492 | Frost | Feb. 6, 1957 |
| 2,793,420 | Johnson et al. | May 28, 1957 |
| 2,805,370 | Wilson | Sept. 3, 1957 |
| 2,811,682 | Pearson | Oct. 29, 1957 |
| 2,813,790 | Hack | Nov. 19, 1957 |
| 2,929,137 | Jones | Mar. 22, 1960 |